US011181397B2

(12) United States Patent
Profeta, Jr.

(10) Patent No.: US 11,181,397 B2
(45) Date of Patent: Nov. 23, 2021

(54) HIGH-RESOLUTION INDEX (HRI) DETECTOR MODULES INCLUDING CAPACITIVE SENSORS AND RELATED SYSTEMS

(71) Applicant: Sensus Spectrum, LLC, Morrisville, NC (US)

(72) Inventor: Joseph Anthony Profeta, Jr., Morrisville, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 58 days.

(21) Appl. No.: 16/671,340

(22) Filed: Nov. 1, 2019

(65) Prior Publication Data

US 2021/0131832 A1    May 6, 2021

(51) Int. Cl.
*G01D 5/24* (2006.01)
*G01D 4/00* (2006.01)
*G01R 27/26* (2006.01)
*G01D 5/241* (2006.01)

(52) U.S. Cl.
CPC ............. *G01D 5/24* (2013.01); *G01D 5/2405* (2013.01); *G01D 5/2412* (2013.01); *G01R 27/26* (2013.01); *G01R 27/2605* (2013.01); *G01D 4/008* (2013.01); *G01D 5/2403* (2021.05)

(58) Field of Classification Search
CPC .. G01D 5/00; G01D 5/12; G01D 5/14; G01D 5/24; G01D 5/2405; G01D 5/241; G01D 5/2417; G01D 4/00; G01D 4/008; G01D 4/02; G01D 5/2403; G01D 5/2412; G01R 27/00; G01R 27/02; G01R 27/26; G01R 27/2605; Y02B 90/20; Y04S 20/30

USPC ....... 324/600, 649, 658, 660, 661, 662, 663, 324/671, 686, 76.11, 118; 702/1, 47, 52
See application file for complete search history.

(56) References Cited

U.S. PATENT DOCUMENTS

| 4,471,450 A |   | 9/1984  | Arnason et al. |
|-------------|---|---------|----------------|
| 4,606,008 A |   | 8/1986  | Wason          |
| 4,779,094 A | * | 10/1988 | Lee ............ G01D 5/2415 324/660 |
| 4,924,407 A |   | 5/1990  | King et al.    |

(Continued)

FOREIGN PATENT DOCUMENTS

| DE | 4234016 A1 | 4/1993 |
|----|------------|--------|
| EP | 1785732 A1 | 5/2007 |

OTHER PUBLICATIONS

International Search Report and Written Opinion Corresponding to International Application No. PCT/US2020/057281; dated Feb. 3, 2021, 13 pages.

(Continued)

*Primary Examiner* — Hoai-An D. Nguyen
(74) *Attorney, Agent, or Firm* — Stanek Lemon Crouse & Meeks, PA (57) ABSTRACT

A high-resolution index (HRI) detector module for use with a meter including an HRI wheel therein having a modulator thereon is provided. The HRI detector module includes a plurality of capacitive sensors positioned on a printed circuit board (PCB). The plurality of capacitive sensors is configured to detect a change in capacitance caused by the modulator of the HRI wheel when the modulator enters into an electric field generated by the plurality of capacitive sensors. Related systems are also provided.

18 Claims, 9 Drawing Sheets

(56) References Cited

U.S. PATENT DOCUMENTS

| | | | |
|---|---|---|---|
| 5,136,286 A | 8/1992 | Veneruso | |
| 6,020,892 A * | 2/2000 | Dillon | G06T 13/40 345/419 |
| 2011/0257901 A1 * | 10/2011 | Bechhoefer | G01H 1/00 702/34 |

OTHER PUBLICATIONS

"QTAN0079 Buttons, Sliders and Wheels, Sensor Design Guide," Atmel Corporation, 2011, 72 pages.
"MSP430 Capacitive Single-Touch Sensor Design Guide, Texas Instruments," Application Report, SLAA379, Jan. 2008, 19 pages.
"Capacitive Touch Sensing, MSP430™ Button Gate Time Optimization and Tuning Guide," Texas Instruments, Application Report, SLAA574, Jan. 2013, 28 pages.
"Capacitive Touch Hardware Design Guide," Texas Instruments, Design Guide, SKAA576A, May 2013—Revised Nov. 2015, 25 pages.

* cited by examiner

HIGH-RESOLUTION INDEX (HRI) DETECTOR MODULES INCLUDING CAPACITIVE SENSORS AND RELATED SYSTEMS

FIELD

The present inventive concept relates generally to meters and, more particularly, to sensing consumption using meters.

BACKGROUND

Meters are generally installed on an exterior of a building to allow access for such things as reading and maintenance. Meters can be simply defined as a tool to measure a customer's usage of a resource at a given location. Meters can be installed in both residential and commercial properties, so utility companies can charge for usage based on the reading from the meter. Besides for billing purposes, a meter can be used for leak detection, or to control usage. For example, a water meter can measure the volume of water usage in gallons or cubic feet. Conventional meters generally include a radio module that allows the meter to communicate with remote locations and, thus, may be read remotely by the utility to determine billing information as well as to notify of possible leaks or excessive use.

Water meters generally contain a high-resolution index (HRI) wheel that is monitored by a reading device in order to provide an accurate reading of a water meter. The wheel is generally a small metal plate attached to a plastic disk that spins as water passes through the meter. Once the position of the disk is obtained the volume of water that passes through the meter between measurements can be obtained.

SUMMARY

Some embodiments of the present inventive concept provide a high-resolution index (HRI) detector module for use with a meter including an HRI wheel therein having a modulator thereon. The HRI detector module includes a plurality of capacitive sensors positioned on a printed circuit board (PCB). The plurality of capacitive sensors is configured to detect a change in capacitance caused by the modulator of the HRI wheel when the modulator enters into an electric field generated by the plurality of capacitive sensors.

In further embodiments, the detector module may communicate with a data processor. The data processor may be configured to determine a position of the modulator on the HRI wheel based on the detected change in capacitance and relative intensity of the detected capacitance change across all of the plurality of capacitive sensors; and provide usage information associated with the meter based on the determined position of the modulator.

In still further embodiments, the plurality of capacitive sensors may include a plurality of capacitive sensors arranged in a circular format.

In some embodiments, the plurality of capacitive sensors may include three capacitive sensors arranged in a circuit format and provide an average arc of 120 degrees each. In certain embodiments, the three capacitive sensors may be physically interleaved such that movement of the modulator on the HRI wheel effects at least two of the three capacitive sensors at any point in time.

In further embodiments, the three capacitive sensors may include three solid sensors separated by approximately thirty degrees on the PCB.

In still further embodiments, the PCB including the plurality of capacitive sensors may be positioned in a housing of the HRI detector module using an adhesive.

In some embodiments, the adhesive may be configured to keep the PCB stationary and in proper position over the HRI wheel in the meter and reduce air gaps between the housing of the HRI detector and a housing of the meter.

In further embodiments, a material having a relatively high permittivity, non-conductive material may be positioned between a housing of the meter and the housing of the HRI detector module.

In still further embodiments, the HRI wheel may include a plastic pointer and wherein the modulator may be a metal modulator.

Still further embodiments of the present inventive concept may provide systems for detecting usage using an HRI detector module.

DETAILED DESCRIPTION

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As discussed in the background, utilities need to determine a volume of water that passes through a meter so that customers may be accurately billed, over-usage can be identified and the like. In water meters, a high resolution index (HRI) wheel is generally monitored by a reading device in order to provide an accurate reading of a mechanical water meter. This wheel is generally a small metal plate attached to a plastic disk that spins as water passes through the meter. Once the position of the disk is obtained the volume of water that passes through the meter between measurements can be obtained. Current HRI detection/reading technologies generally rely on inductive sensors, however, these sensors suffer from resolution and power consumption issues. Accordingly, some embodiments of the present inventive concept provide low-power, accurate methods and systems to obtain a position of the HRI disk. Embodiments discussed herein provide more resolution and do not consume as much power as conventional methods. These embodiments provide a relatively high resolution, capacitive sensor for detecting the position of an HRI wheel on a mechanical water meter for use in an attached reading device in accordance with embodiments of the inventive concept will be discussed herein with respect to the figures.

It will be understood that although embodiments of the present inventive concept are discussed herein with respect to specific meters, embodiments of the present inventive concept are not limited to the examples provided herein. Sensors discussed herein can be used in any device that may benefit from the presence thereof without departing from the scope of the present inventive concept.

Figure 1:
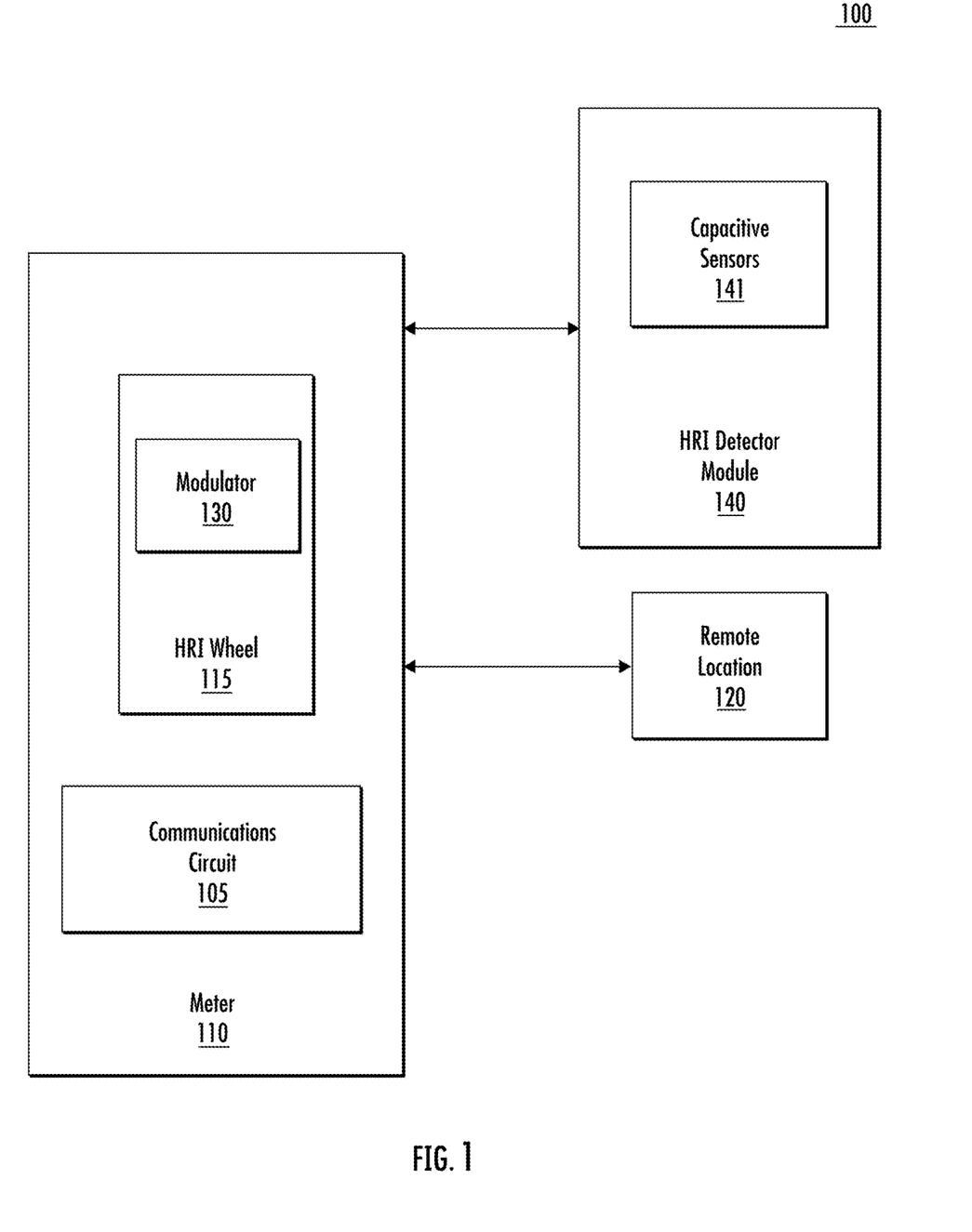
FIG. 1 is a diagram of a system including a meter including a capacitive detector and a remote location in accordance with some embodiments of the present inventive concept.

Referring first to FIG. 1, a system including an HRI detector module in accordance with some embodiments of the present inventive concept will be discussed. As illustrated, the system 100 includes a meter 110, for example, a mechanical water meter; an HRI detector module 140 including a plurality of capacitive sensors 141 in accordance with embodiments discussed herein; and a remote location 120, for example, a utility. The meter 110 includes a communication circuit 105 that communicates with the remote location 120, an HRI wheel 115 including a modulator 130 thereon in accordance with embodiments discussed herein. It will be understood that although the system includes a single meter, a single detector and a single remote location, embodiments of the present inventive concept are not limited to this configuration. Multiple meters, detectors and/or remote locations as well as other devices may be included in the system without departing from the scope of the present inventive concept. Similarly, although the meter 110 and the HRI detector module 140 are shown as separate elements, these elements may be combined in some embodiments as indicated by the dotted lines in FIG. 2. In particular, in some embodiments, the HRI detector module 140 may be included in the meter 110 itself. Furthermore, although embodiments discussed herein refer to a mechanical water meter 110, embodiments are not limited to this configuration.

In some embodiments, meters 110 having communications circuits 105 therein can be termed "smart meters" and are configured to send data to and receive data from the remote location 120. This allows monitoring and control of the meter from the remote location. Meters provided by Sensus may use FLEXNET, a radio network that operates in licensed spectrum in the 900 MHz range, with the uplink utilizing 901 to 902 MHz and the downlink utilizing 940 to 941 MHz. These spectrum allocations are subdivided into multiple narrowband channels, for example, 25 KHz channels. Individual narrowband channels can be allocated to respective control modules, or a set of control modules can be assigned to operate on one or more such channels, while other groups are assigned to other channels. Data is sent on a per-channel basis using Frequency Shift Keying ("FSK"), for example, 4, 8, or 16FSK, where the data may be "packaged" in messages of a predefined bit length. Although some embodiments may use the FLEXNET as the radio communication network, embodiments of the present inventive concept are not limited thereto. Any radio network may be used without departing from the scope of the present inventive concept, for example, a Zigbee protocol/network may be used in some embodiments.

Figure 2:
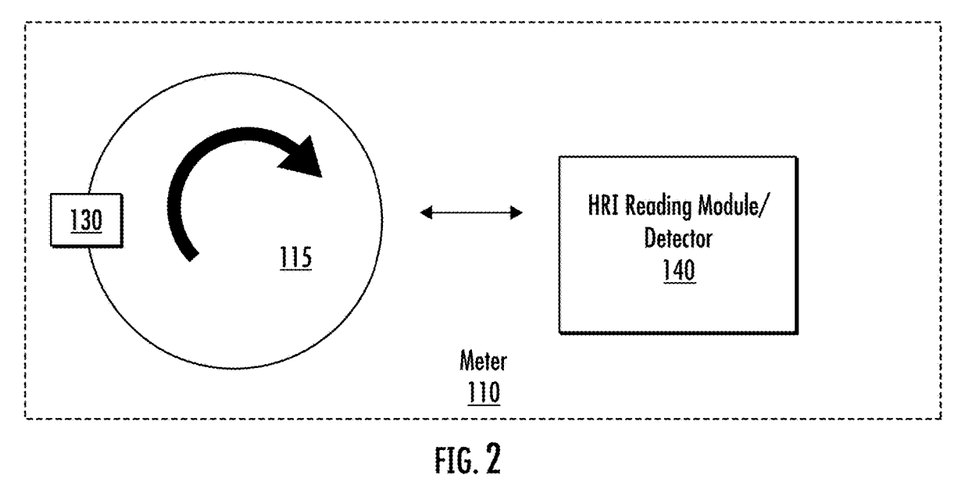
FIG. 2 is a block diagram of an high-resolution index (HRI) of a meter and an associated detector in accordance with some embodiments of the present inventive concept.

The HRI wheel/disk 115 of the water meter 110 is monitored by a reading/detector device in order to provide an accurate reading of a mechanical water meter. As illustrated in FIG. 2, the HRI wheel 115 may be disk shaped (a plastic disk) having a modulator 130 associated therewith that spins as water passes through the meter 110. Once the position of the disk 115 is obtained the volume of water that passes through the meter 110 between measurements can be obtained. In particular embodiments of the present inventive concept, the HRI detector module 140 includes a plurality of capacitive sensors 141 associated with the HRI wheel 115.

These capacitive sensors 141 detect the position of the modulator 130, for example, a metal modulator on the rotating high-resolution index (HRI) wheel 115 of the mechanical water meter 110. Capacitive sensors in accordance with embodiments discussed herein use less physical space than the equivalent magnetic/inductive sensors used in conventional devices and may be less susceptible, or possibly, immune, to magnetic interference. Electrostatic interference can be detected by the capacitive sensors 141 by analyzing all sensor inputs. The higher sample rate could be used to mitigate instances of electrostatic interference. Sensors in accordance with embodiments discussed herein are configured to operate by detecting a change in capacitance by a foreign object entering the electric field generated by a capacitor. Materials of different permittivity allow more or less energy to be stored by the capacitor and this energy may be measured by the HRI detector module 140.

Figure 3:
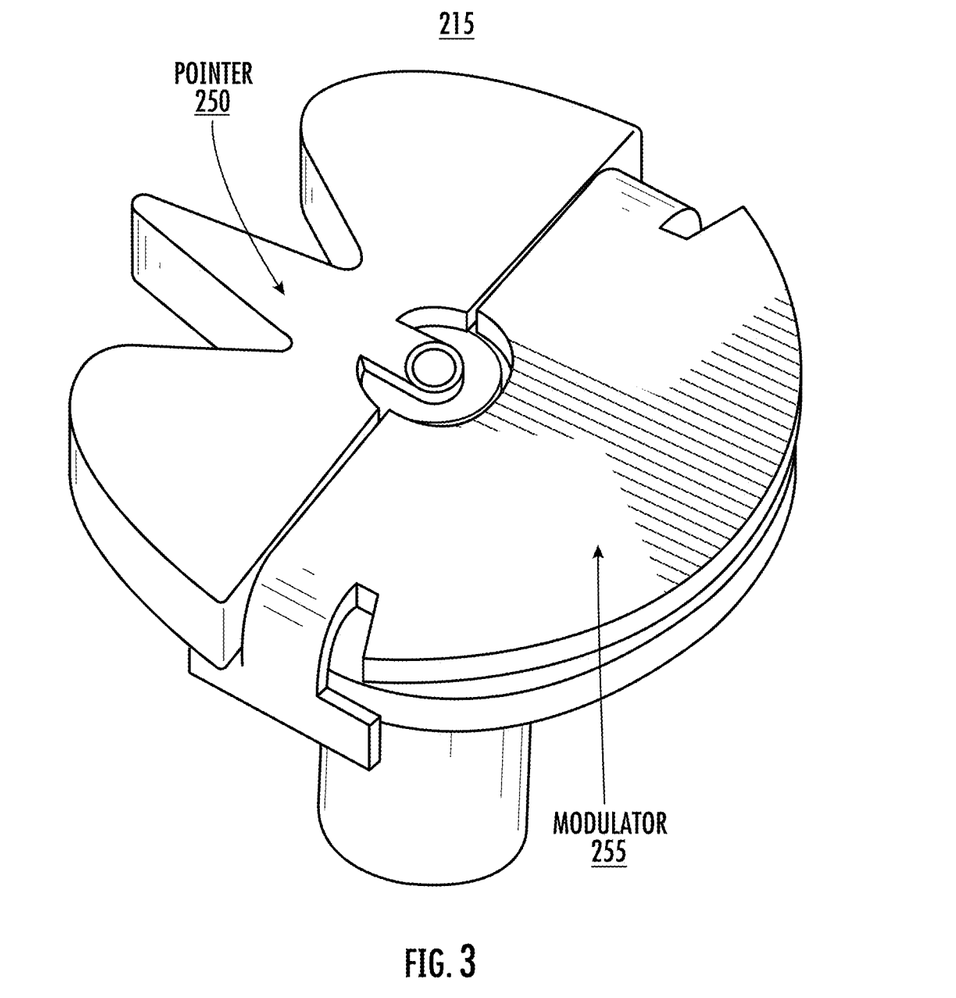
FIG. 3 is a diagram of an HRI wheel including a modulator in accordance with some embodiments of the present inventive concept.

Referring now to FIG. 3, an example HRI wheel/disk 215 in accordance with embodiments of the present inventive concept will be discussed. As illustrated in FIG. 3, the HRI wheel 215 includes a plastic pointer 250 with a metal modulator 255. The position of the metal modulator 255 is obtained in some embodiments using the HRI detector module 140 having multiple capacitive sensors 141 arranged in a circle. The position of a modulator 255 rotating about the geometric center of these sensors can be calculated and used to determine the rotations of the HRI wheel and water consumption. In some embodiments, the sensor design of the detector 140 uses three circular capacitors that form an average arc of 120 degrees each, graphically illustrated as A, B and C in FIG. 4. In some embodiments, the three circular capacitors are physically interleaved, such that the modulator 255 will affect the capacitance of at least two of the three capacitive sensors at any given time. The position of the center of the modulator 255 can be calculated by the relative intensity of the capacitance changes across all plates.

Furthermore, the HRI detector module 140 including the capacitive sensors 141 may detect potential tampering. For example, the baseline capacitance of all of the capacitive sensors may be monitored and if it is determined that the baseline capacitance changes beyond a predetermined drift, it can be assumed that a bad actor is attempting to tamper with the measurement apparatus. As used herein, the predetermined drift may be specific to the devices being monitored. A "normal" operation for each device may be established over time and the predetermined drift may be related to this normal operation. Thus, no specific range for predetermined drift need be supplied.

Figure 4:
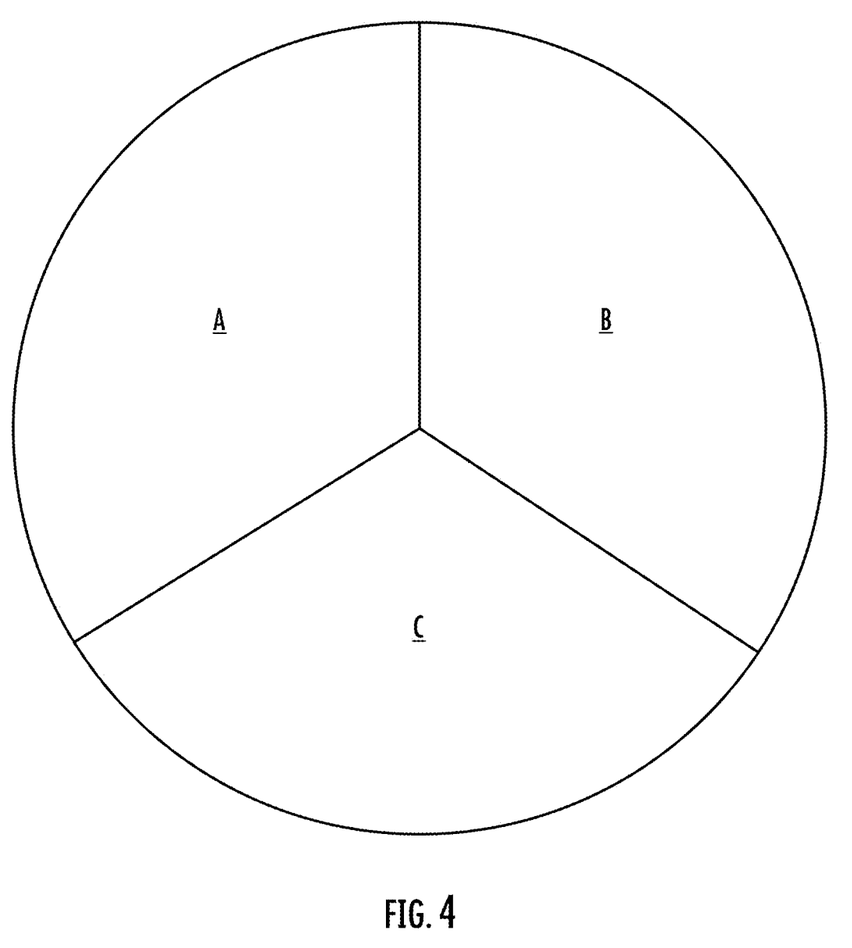
FIG. 4 is a diagram illustrating 120 degree sectors in accordance with some embodiments of the present inventive concept.

Those of skill in the art may use many methods for calculating the position of the HRI wheel 115 based on the capacitances from the capacitive sensors. In some embodiments, calculating the position of the HRI wheel may be very similar to convert from the red, green, blue (RGB) to HSV/HSL (hue, saturation, value/lightness) color spaces. In these embodiments, each of three 120 degree arc capacitors of the detector module 140 can be considered either red, blue, or green (A, B and C respectively in FIG. 4) and one is attempting to calculate the hue. The following algorithm is used to obtain the position of the HRI wheel 115:

Given
A∈[0,1]⇒Intensity of capacitor centered at 0°
B∈[0,1]⇒Intensity of capacitor centered at 120°
C∈[0,1]⇒Intensity of capacitor centered at 240°
Let $$M = \text{MAX}(A,B,C) \quad \text{(Eqn. 1)}$$

$$m = \text{MIN}(A,B,C) \quad \text{(Eqn. 2)}$$

$$R = M - m \quad \text{(Eqn. 3)}$$

where R is the arithmetic range of values measured. To determine what section of the unit circle the disk belongs, the capacitor with the highest intensity is identified. By using the values of the other two capacitors (not the capacitor with the highest intensity), an offset from the center can be calculated (H).

$$H' = \begin{cases} \text{undefined}, & \text{if } R = 0 \\ 0 + \dfrac{B-C}{R} & \text{if } M = A \\ 2 + \dfrac{C-A}{R} & \text{if } M = B \\ 4 + \dfrac{A-B}{R} & \text{if } M = C \end{cases} \quad \text{(Eqn. 4)}$$

$$H = (60° \cdot H') \bmod 360° \quad \text{(Eqn. 5)}$$

At this point, the value for H can be mapped to the total resolution of a single turn of the HRI wheel, for instance $$\delta H = \frac{360°}{0.001 \text{ m}^3},$$

and metrology can proceed.

Figure 5:
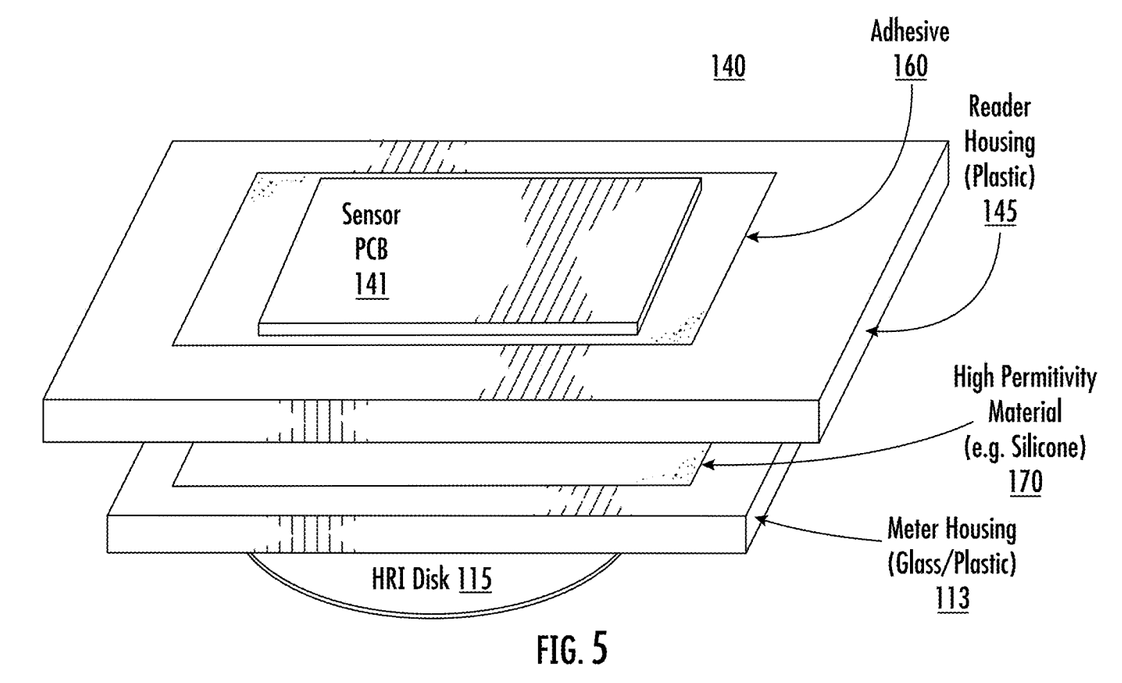
FIG. 5 is a diagram illustrating a printed circuit board (PCB) of a detector and meter in accordance with some embodiments of the present inventive concept.

Referring now to FIG. 5, a diagram illustrating positioning of the HRI wheel 115, the meter 110 and the sensors of the detector in accordance with some embodiments of the present inventive concept will be discussed. As illustrated in FIG. 5, the HRI wheel 115 is provided inside the meter housing 113, the HRI detector module 140 including the capacitive sensors 141 on the detector housing 145. The mechanical design of capacitive sensors 141 discussed herein is critical to ensure the electric field generated by the capacitor electrode can propagate all the way to the HRI disk 115. In some embodiments, the capacitive sensor 141 system includes three main components: a printed circuit board (PCB) with the capacitor plates and driving/measurement circuitry (discussed below); an adhesive 160 to keep the PCB 141 in place on the detector housing 145, which may be plastic, and to eliminate air-gaps; and a high-permittivity, non-conductive material, for example, silicone, to reduce, or possibly eliminate, the air-gap between the detector housing 145 and the meter housing 113, which may be, for example, glass or plastic in some embodiments.

Care must be taken when placing the PCB 141 and the presence of air-gaps should be very limited. Although an adhesive 160 is discussed as holding the sensor PCB 141 in place, other features in the detector housing 145 may be used in addition to the adhesive. However, the PCB should be positioned directly above a center of the HRI disk 115 as close as physically possible. A feature in the detector housing 145 may be used to hold the PCB 142 in the correct position relative to the meter housing 113.

The high permittivity material between the meter housing 113 and the detector housing 145 enables an electric field generated by the capacitors to travel downwards while maintaining its field density. The permittivity of the high permittivity material may be equal to or higher than plastic to increases the overall capacitance of the sensor and allow the modulator on the HRI disk to have a larger effect on the capacitance measurements.

The design of the capacitor plates effects the sensitivity and accuracy of the position calculation. In some embodiments, the plates may be interleaved so that there is generally always a change in the capacitance of at least two plates regardless of the position of the HRI modulator. In some embodiments, an optional guard ring is added around the main position capacitors, which may improve performance.

Figure 6:
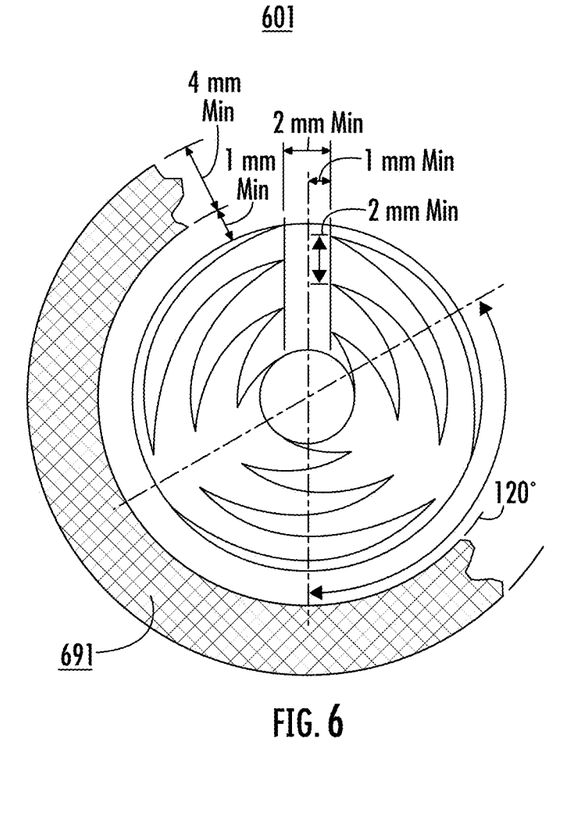
FIGS. 6 and 7 are diagrams of detectors including interleaved sensors in accordance with some embodiments of the present inventive concept.

Referring now to FIG. 6, a sensor design in accordance with some embodiments of the present inventive concept will be discussed. As illustrated, the sensor 601, includes three circular, interleaved capacitors in the three 120 degree sectors as discussed above. To maintain proper capacitance, a spacing of at least 0.1 mm is provided between each capacitor. Furthermore, the interleaved segments do not extend within ±1 mm from the center line at 0°, 120°, and 240°. Each point of the interleaved sections is placed at least 2 mm apart. Sensors according to these embodiments keep a minimum continuous surface area for the capacitors. It will be understood that although only three interleaved capacitors are discussed herein, more than three capacitors may be used to provide for increased position resolution without departing from the scope of the present inventive concept.

Figure 7:
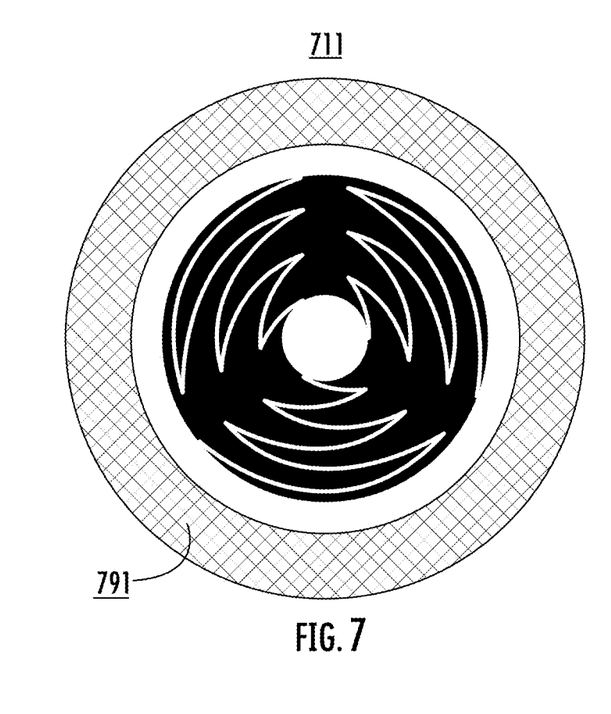

If the sensor of FIG. 6 is positioned on a top layer of a PCB, a hatched ground plane may be including on the bottom layer to shield from radio frequency (RF)/electromagnetic (EM) and electrostatic interference. An optional guard region 691/791 can be added around the capacitors to facilitate shielding as shown in FIGS. 6 and 7. This can be provided by, for example, a solid or a hatched region of copper on the PCB. A distance of at least 1 mm from the edge of the sensor capacitors should be maintained and may be at least 4 mm wide. In some embodiments, the sensor 691 includes an interleaved capacitive sensor having an outer diameter of 15 mm and inner diameter of 4 mm and an appropriate guard ring.

The sensor 601 of FIG. 6 illustrates dimensions of sensors in accordance with some embodiments of the present inventive concept. The sensor 711 of FIG. 4 illustrates a sensor design based on capacitive touch scroll wheels used in some human-interface devices. In some embodiments, the material used may be copper. It will be understood that the sensors in FIGS. 6 and 7 are not drawn to scale and provided for example only.

Figure 8:
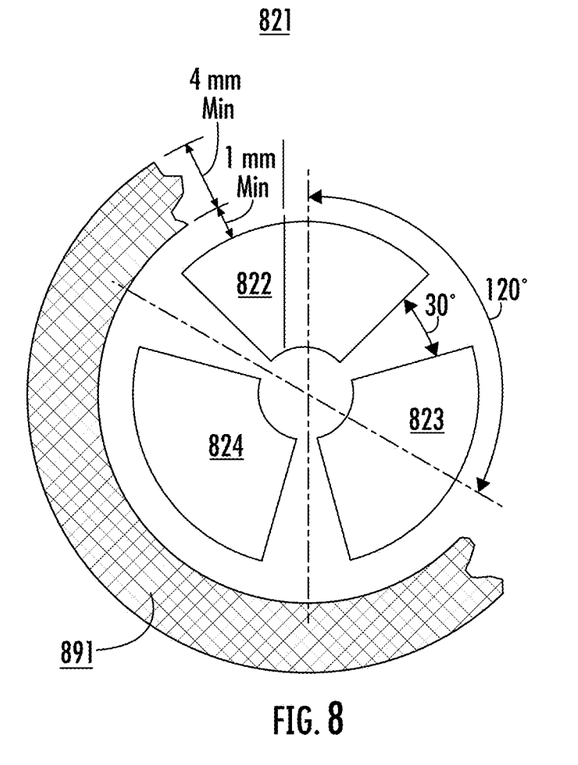
FIGS. 8 and 9 are diagrams illustrating detectors including non-interleaved sensors in accordance with some embodiments of the present inventive concept.
Figure 9:
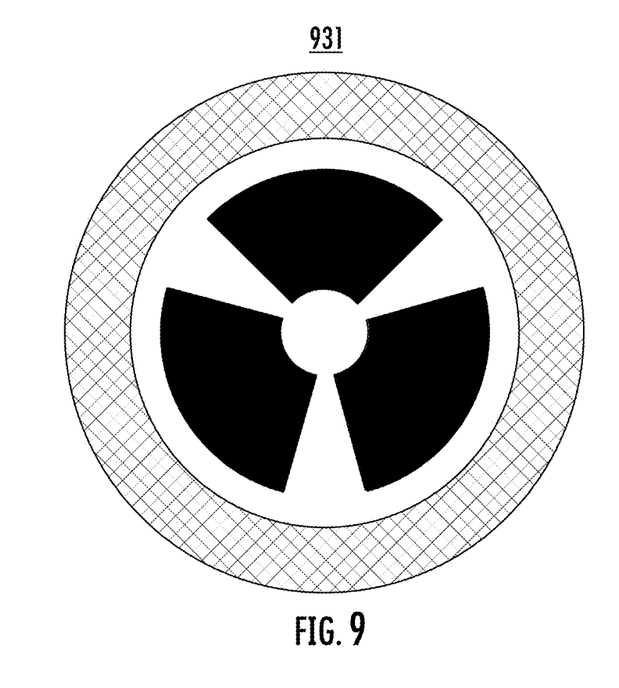

Referring now to FIGS. 8 and 9, sensor designs that lack interleaved sensors as discussed above will be discusses. As discussed above, some embodiments of the present inventive concept provide a detector having a plurality of interleaved sensors. The sensor 821 does not include interleaved sensors, but includes three solid copper sensors 822, 823 and 824 separated by 30°. Sensors using this design may have increased signal separation between the sensors which may increase the overall signal-to-noise (SNR) ratio. The sensor 821 of FIG. 8 illustrates dimensions of sensors having three solid copper sensors in accordance with some embodiments of the present inventive concept. The sensor 931 of FIG. 9 illustrates that in some embodiments, the material used may be copper. It will be understood that the sensors in FIGS. 8 and 9 are not drawn to scale and provided for example only. It will be further understood that although only three copper sensors are provided in FIGS. 8 and 9, embodiments of the present inventive concept are not limited thereto. More than three solid sensors may be included in the detector without departing from the scope of the present inventive concept.

Figure 10:
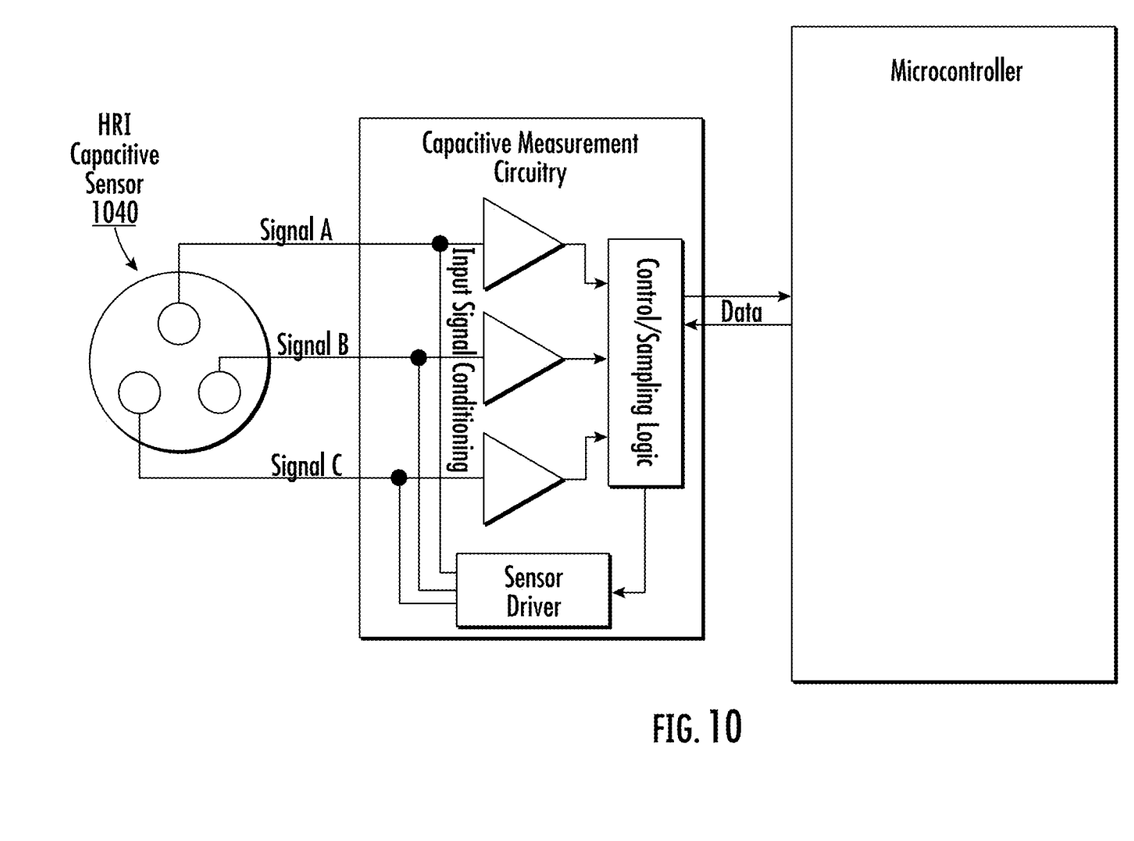
FIG. 10 is a block diagram of an example driver in accordance with some embodiments of the present inventive concept.

Referring now to FIG. 10, a block diagram of a detector in accordance with some embodiments of the present inventive concept will be discussed. As illustrated in FIG. 10, the HRI detector 1040 includes a plurality of capacitive sensors each having a corresponding signal A, B and C, respectively. It will be understood that the detector including the capacitive sensors can be driven by any method that returns some value that is related to the capacitance of the three capacitors that make up the sensor. There are multiple capacitive sensor driver circuits that could be used including, but not limited to a single RC decay counter, pulse width modulation (PWM) modulator, 555 timer, or frequency counter. FIG. 10 illustrates a general driver and sampling circuit that may be used in accordance with embodiments discussed herein. However, embodiments of the present inventive concept are not limited thereto.

Figure 11:
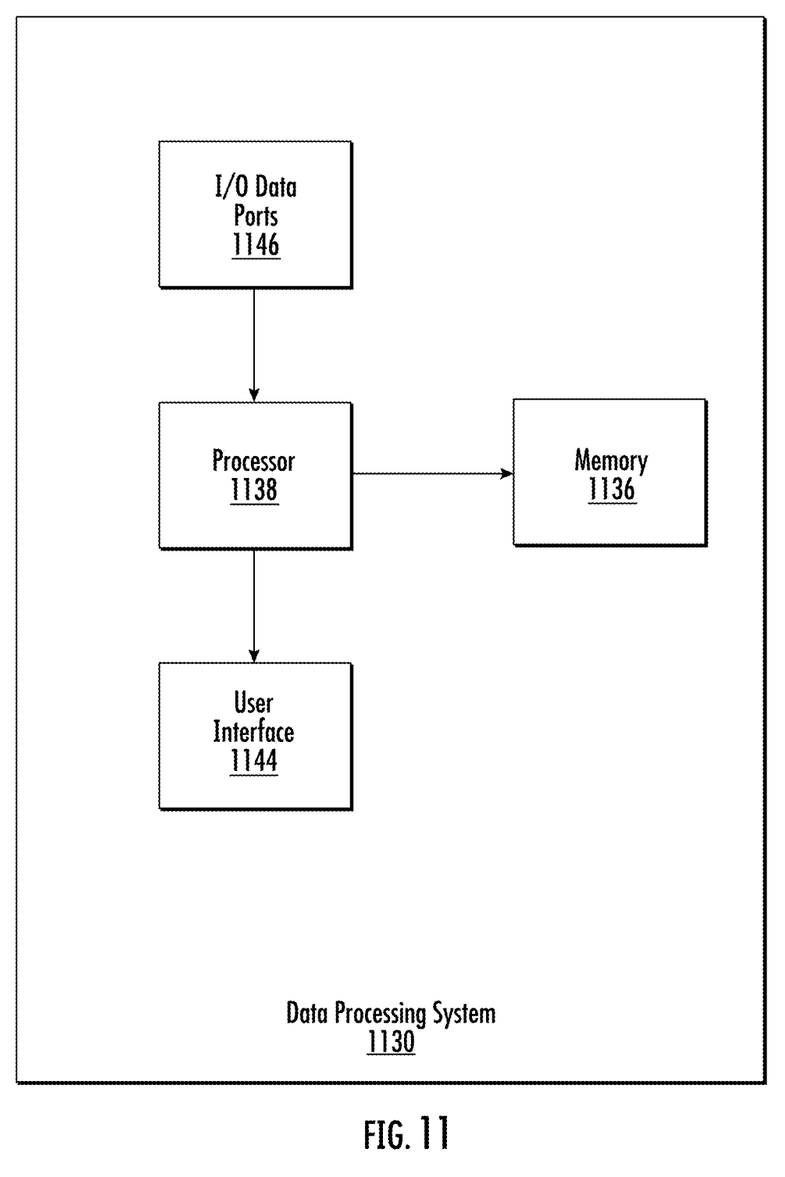
FIG. 11 is a block diagram of an example data processor that may be used in accordance with various embodiments of the present inventive concept.

As is clear from above, some aspects of the present inventive concept may be implemented using a data processing system. For example, processing equations 1 through 5 set out above and determining water usage may require the use of a processor. The data processing systems may be included in any of the devices discussed herein without departing from the scope of the present inventive concept. For example, the processor may be included in a meter, a remote location, a detector or any combination. Example embodiments of a data processing system 1130 configured in accordance with embodiments of the present inventive concept will be discussed with respect to FIG. 11. The data processing system 1130 may include a user interface 1144, including, for example, input device(s) such as a keyboard or keypad, a display, a speaker and/or microphone, and a memory 1136 that communicate with a processor 1138. The data processing system 1130 may further include I/O data port(s) 1146 that also communicates with the processor 1138. The I/O data ports 1146 can be used to transfer information between the data processing system 1130 and another computer system or a network. These components may be conventional components such as those used in many conventional data processing systems, which may be configured to operate as described herein.

As briefly discussed above, some embodiments of the present inventive concept provide a detector including a plurality of capacitive sensors that enable low-power, accurate methods and systems to obtain a position of the HRI disk. Embodiments discussed herein provide more resolution and do not consume as much power as conventional methods. Embodiments discussed herein provide a relatively high resolution, detector using capacitive sensors for detecting the position of an HRI wheel on a mechanical water meter for use in an attached reading device in accordance with embodiments of the inventive concept will be discussed herein with respect to the figures.

As will be appreciated by one of skill in the art, the inventive concept may be embodied as a method, data processing system, or computer program product. Accordingly, the present inventive concept may take the form of an entirely hardware embodiment or an embodiment combining software and hardware aspects all generally referred to herein as a "circuit" or "module." Furthermore, the present inventive concept may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the present inventive concept may be written in an object-oriented programming language such as Java®, Smalltalk or C++. However, the computer program code for carrying out operations of the present inventive concept may also be written in conventional procedural programming languages, such as the "C" programming language or in a visually oriented programming environment, such as VisualBasic.

The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The inventive concept is described in part below with reference to a flowchart illustration and/or block diagrams of methods, systems and computer program products according to embodiments of the inventive concept. It will be understood that each block of the illustrations, and combinations of blocks, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A high-resolution index (HRI) detector module for use with a meter including an HRI wheel therein having a modulator thereon, the HRI detector module comprising a plurality of capacitive sensors positioned on a printed circuit board (PCB),
    wherein the plurality of capacitive sensors is configured to detect a change in capacitance caused by the modulator of the HRI wheel when the modulator enters into an electric field generated by the plurality of capacitive sensors; and
    wherein the HRI wheel comprises a plastic pointer and wherein the modulator is a metal modulator.

2. The detector module of claim 1, wherein the detector module communicates with a data processor and wherein the data processor is configured to:
    determine a position of the modulator on the HRI wheel based on the detected change in capacitance and relative intensity of the detected capacitance change across all of the plurality of capacitive sensors; and
    provide usage information associated with the meter based on the determined position of the modulator.

3. The detector module of claim 1, wherein the plurality of capacitive sensors comprises a plurality of capacitive sensors arranged in a circular format.

4. The detector module of claim 3, wherein the plurality of capacitive sensors comprises three capacitive sensors arranged in a circuit circular format and provide an average arc of 120 degrees each.

5. The detector module of claim 4, wherein the three capacitive sensors are physically interleaved such that movement of the modulator on the HRI wheel effects at least two of the three capacitive sensors at any point in time.

6. The detector module of claim 4, wherein the three capacitive sensors comprise three solid sensors separated by approximately thirty degrees on the PCB.

7. The detector module of claim 1, wherein the PCB including the plurality of capacitive sensors is positioned in a housing of the HRI detector module using an adhesive.

8. The detector module of claim 7, wherein the adhesive is configured to keep the PCB stationary and in proper position over the HRI wheel in the meter and reduce air gaps between the housing of the HRI detector and a housing of the meter.

9. The detector module of claim 7, wherein a material having a relatively high permittivity, non-conductive material is positioned between a housing of the meter and the housing of the HRI detector module.

10. A system for detecting usage, the system comprising:
    a high-resolution index (HRI) detector module comprising a plurality of capacitive sensors positioned on a printed circuit board; and
    a mechanical water meter coupled to the HRI detector module and including an HRI wheel having a modulator thereon,
    wherein the plurality of capacitive sensors is configured to detect a change in capacitance caused by the modulator of the HRI wheel when the modulator enters into an electric field generated by the plurality of capacitive sensors; and
    wherein the HRI wheel comprises a plastic pointer and wherein the modulator is a metal modulator.

11. The system of claim 10, wherein the PCB including the plurality of capacitive sensors is positioned in a housing of the HRI detector module using an adhesive.

12. The system of claim 10, further comprising a processor in communication with the mechanical water meter and/or the HRI detector module and configured to:
    determine a position of the modulator on the HRI wheel based on the detected change in capacitance and relative intensity of the detected capacitance change across all of the plurality of capacitive sensors; and
    provide usage information associated with the meter based on the determined position of the modulator.

13. The system of claim 10, wherein the plurality of capacitive sensors comprises a plurality of capacitive sensors arranged in a circular format.

14. The system of claim 13, wherein the plurality of capacitive sensors comprises three capacitive sensors arranged in a circuit format and provide an average arc of 120 degrees each.

15. The system of claim 14, wherein the three capacitive sensors are physically interleaved such that movement of the modulator on the HRI wheel effects at least two of the three capacitive sensors at any point in time.

16. The system of claim 14, wherein the three capacitive sensors comprise three solid sensors separated by approximately thirty degrees on the PCB.

17. The system of claim 11, wherein a material having a relatively high permittivity, non-conductive material is positioned between a housing of the meter and the housing of the HRI detector module.

18. The system of claim 11, wherein the adhesive is configured to keep the PCB stationary and in proper position over the HRI wheel in the meter and reduce air gaps between the housing of the HRI detector and a housing of the meter.

* * * * *

UNITED STATES PATENT AND TRADEMARK OFFICE
CERTIFICATE OF CORRECTION

PATENT NO. : 11,181,397 B2  
APPLICATION NO. : 16/671340  
DATED : November 23, 2021  
INVENTOR(S) : Profeta, Jr.

Page 1 of 1

It is certified that error appears in the above-identified patent and that said Letters Patent is hereby corrected as shown below:

In the Claims

Column 10, Claim 4, Line 8: Please correct "in a circuit circular" to read -- in a circular --

Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*